(12) United States Patent
Sako

(10) Patent No.: US 7,813,205 B2
(45) Date of Patent: Oct. 12, 2010

(54) SEMICONDUCTOR MEMORY DEVICE

(75) Inventor: Atsumasa Sako, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 72 days.

(21) Appl. No.: 12/212,066

(22) Filed: Sep. 17, 2008

(65) Prior Publication Data

US 2009/0022002 A1     Jan. 22, 2009

Related U.S. Application Data

(62) Division of application No. 11/704,951, filed on Feb. 12, 2007, now Pat. No. 7,443,754, which is a division of application No. 11/172,894, filed on Jul. 5, 2005, now Pat. No. 7,184,349.

(30) Foreign Application Priority Data

Feb. 22, 2005   (JP)  ............................ 2005-044895

(51) Int. Cl.
    *G11C 7/00*     (2006.01)
    *G11C 7/04*     (2006.01)
    *G11C 11/34*     (2006.01)

(52) U.S. Cl. ........................ 365/222; 365/211; 365/212

(58) Field of Classification Search .................. 365/222
See application file for complete search history.

(56) References Cited

U.S. PATENT DOCUMENTS

| | | | |
|---|---|---|---|
| 5,278,796 A | 1/1994 | Tillinghast et al. | |
| 5,375,093 A | 12/1994 | Hirano | |
| 5,600,281 A | 2/1997 | Mori et al. | |
| 5,875,142 A | 2/1999 | Chevallier | |
| 6,281,760 B1 | 8/2001 | Koelling et al. | |
| 6,531,911 B1 | 3/2003 | Hsu et al. | |
| 6,667,925 B2 | 12/2003 | Kobayashi et al. | |
| 6,934,645 B2* | 8/2005 | Kim | 702/64 |
| 6,937,087 B2 | 8/2005 | Sim et al. | |
| 6,970,393 B1 | 11/2005 | Cho et al. | |
| 7,035,157 B2* | 4/2006 | Chang | 365/222 |
| 7,149,644 B2 | 12/2006 | Kobayashi et al. | |
| 7,158,422 B2* | 1/2007 | Choi | 365/189.03 |
| 7,171,327 B2* | 1/2007 | Kim | 702/130 |
| 7,248,527 B2* | 7/2007 | Park | 365/222 |
| 7,292,491 B2* | 11/2007 | Sinha et al. | 365/222 |
| 7,305,518 B2* | 12/2007 | Zeighami et al. | 711/106 |
| 7,395,176 B2* | 7/2008 | Chung et al. | 702/132 |

(Continued)

FOREIGN PATENT DOCUMENTS

| | | |
|---|---|---|
| JP | 2000-055742 | 2/2000 |
| JP | 2003-132678 | 5/2003 |

*Primary Examiner*—Son L Mai

(57) ABSTRACT

A semiconductor memory device is provided for minutely changing a refresh interval according to a detected temperature and thereby lowering its power consumption. A temperature detector detects a temperature of a chip and outputs the corresponding temperature signal. A reference temperature signal output unit outputs the corresponding reference temperature signal with each of different reference temperatures to be compared with the chip temperature according to a selection signal. A temperature comparison unit compares the chip temperature with the reference temperature through the temperature signal and the reference temperature signal. A selection signal output unit outputs the selection signal according to the compared result of the temperature comparison unit. A refresh interval control unit changes the refresh interval according to the compared result of the temperature comparison unit.

14 Claims, 16 Drawing Sheets

U.S. PATENT DOCUMENTS

| | | | |
|---|---|---|---|
| 7,441,949 B2 * | 10/2008 | Janzen et al. | 374/171 |
| 7,583,553 B2 * | 9/2009 | Mori | 365/222 |
| 2005/0024097 A1 | 2/2005 | Sim et al. | |
| 2006/0066386 A1 | 3/2006 | Hong | |
| 2006/0098509 A1 | 5/2006 | Kim | |
| 2007/0043522 A1 | 2/2007 | Kobayashi et al. | |

* cited by examiner

| detz | latzn-1 | latzn | latzn+1 | N1 |
|---|---|---|---|---|
| 0 | 0 | 0 | 0 | 1 |
| 0 | 0 | 0 | 1 | 0 |
| 0 | 0 | 1 | 0 | 1 |
| 0 | 0 | 1 | 1 | 1 |
| 0 | 1 | 0 | 0 | 1 |
| 0 | 1 | 0 | 1 | 1 |
| 0 | 1 | 1 | 0 | 1 |
| 0 | 1 | 1 | 1 | 1 |
| 1 | 0 | 0 | 0 | 1 |
| 1 | 0 | 0 | 1 | 1 |
| 1 | 0 | 1 | 0 | 1 |
| 1 | 0 | 1 | 1 | 0 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

FIG. 9

SEMICONDUCTOR MEMORY DEVICE

CROSS-REFERENCE TO RELATED APPLICATION

This application is a divisional of U.S. patent application Ser. No. 11/704,951, filed Feb. 12, 2007, which is a divisional of U.S. patent application Ser. No. 11/172,894 filed Jul. 5, 2005, now U.S. Pat. No. 7,184,349, which issued Feb. 27, 2007, and is based upon and claims the benefit of priority from Japanese Patent Application No. 2005-044895, filed on Feb. 22, 2005, the entire contents of which are incorporated herein by reference.

BACKGROUND OF THE INVENTION (1) Field of the Invention

The present invention relates to a semiconductor memory device, and more particularly to a semiconductor memory device which is arranged to perform a refresh operation for holding data stored therein.

(2) Description of the Related Art

For memory devices provided in portable appliances such as cellular phones, conventionally, SRAMs have been mainly used. Today, however, the increase of a necessary memory capacity results in requiring a large-capacity memory like a DRAM for such portable appliances. The shortcoming involved in the use of such a large-capacity memory is a life of a cell used in a portable appliance.

Though the SRAM hardly consumes electric power for holding data, the DRAM is required to periodically perform a refresh operation for holding data. It means that the DRAM consumes a certain amount of electric power even when it stays on standby. That is, even when the portable appliance is not used, the DRAM consumes electric power for holding data, which leads to consuming up the power stored in a backup cell.

In order to solve this shortcoming, it is just necessary to reduce the times of the refresh operation on standby, for reducing the power consumption. For example, the data holding time of the DRAM is characterized to be longer as the temperature becomes lower. Hence, when the ambient temperature is lower than a specific reference temperature, the interval between the refresh operation is set to be longer, for reducing the times of the refresh operation.

FIG. 12 shows relation between a data holding time and a temperature. In FIG. 12, a waveform W11 denotes the temperature dependency of the data holding time of a DRAM cell, while a waveform W12 denotes an interval between the refresh operation of the DRAM cell. The time on the axis of ordinance is denoted on a log scale. As indicated by the waveform W11, the DRAM cell has a longer data holding time as the temperature becomes lower. Hence, as indicated by the waveform W12, when the temperature of the chip is lower than a predetermined reference temperature Tth, the interval between the refresh operation is set to be longer, while when the temperature of the chip is higher than the reference temperature Tth, the interval between the refresh operation is set to be shorter. This setting makes it possible to reduce the power consumption.

FIG. 13 is a block diagram showing a control circuit for controlling the interval between the refresh operation shown in FIG. 12. As shown in FIG. 13, the control circuit includes a reference level circuit 101, a temperature detector 102, a frequency division controller 103, a ring oscillator 104, and a frequency divider 105.

The reference level circuit 101 operates to output a constant reference voltage that does not depend upon the variations of a temperature and a power supply. The temperature detector 102 operates to compare the reference voltage supplied from the reference level circuit 101 with a voltage changing in dependency on the temperature and then output the compared result to the frequency division controller 103. That is, the temperature detector 103 determines if the temperature of the chip (that is, the DRAM cell) is higher or lower than the reference temperature. The frequency division controller 103 controls a frequency dividing ratio of the frequency divider 105 according to the determined result sent from the temperature detector 102. For example, the the temperature detector 102 determines that the temperature of the chip is lower than the reference temperature, the frequency division controller 103 controls the frequency divider so that the frequency (dividing ratio may be larger. When the temperature detector 102 determines that the temperature of the chip is higher than the reference temperature, the frequency division controller 103 controls the frequency divider 105 so that the frequency dividing ratio may be smaller.

The ring oscillator 104 is composed of inverters 104a to 104e. The oscillating signal generated by the inverters 104a to 104e is outputted to the frequency divider 105 through the inverter 104f. The frequency divider 105 is composed of flip-flops 105a to 105e. The frequency divider 105 counts based on the oscillating signal sent from the ring oscillator 104 and outputs a refresh request signal when the count reaches a predetermined value. The frequency divider 105 may change its frequency dividing ratio under the control of the frequency division controller 103. The refresh request signal is outputted to the refresh circuit. In response to the signal, the refresh circuit operates to refresh the data stored in the DRAM cell.

FIG. 14 is a circuit diagram showing the reference level circuit shown in FIG. 13. As shown in FIG. 14, the reference level circuit 101 divides the voltage VRFV that does not depend upon the variations of the temperature and the power supply through the use of resistors R101 and R102 and then outputs the resulting reference voltage vref.

FIG. 15 is a circuit diagram showing the temperature detector shown in FIG. 13. As shown in FIG. 15, the temperature detector 102 is composed of inverters 111, 112, PMOS transistors M101 to M105, NMOS transistors M106 to M108, a resistor R111, and a diode D101.

When a temperature detection enable signal detenz is at the H (High) level, the temperature detector 102 operates to compare the reference voltage vref with a monitor voltage vmoni at a contact point between the diode D101 and the resistor R111 and to output the compared result as the temperature detection signal detectz through the inverter 112. The threshold value of the diode D101 changes in dependency upon the temperature and the monitor voltage vmoni is lower as the temperature is higher.

When the monitor voltage vmoni is higher than the reference voltage vref, that is, the temperature of the chip is lower than the reference temperature, the temperature detector 102 outputs the temperature detection signal detectz at the H level. When the monitor voltage vmoni is lower than the reference voltage vref, that is, the temperature of the chip is higher than the reference temperature, the temperature detector 102 outputs the temperature detection signal detect at the L (Low) level. The temperature detection signal detectz is outputted to the frequency divider 105. Then, the frequency divider 105 changes the frequency dividing ratio in dependency upon the state of this temperature detection signal, detectez.

FIG. 16 is an explanatory view showing the operation of the temperature detector shown in FIG. 15. In FIG. 16A shows relation between the reference voltage vref and the monitor voltage vmoni. FIG. 16B shots the voltage of the output (the drain of a transistor M106) of a differential amplifier composed of transistors M103, M104 and M106 to M108. FIG. 16C shows the voltage of the temperature detection signal detectz.

As shown in FIG. 16A, when the monitor voltage vmoni is higher than the reference voltage vref, the differential amplifier outputs the signal at the L state as shown in FIG. 16B. This signal is inverted by the inverter 112 so that the signal may be changed into the temperature detection signal detectz at the H level as shown in FIG. 16C. Further, as shown in FIG. 16A, when the monitor voltage vmoni is lower than the reference voltage vref, the differential amplifier outputs the signal at the H level as shown in FIG. 16B. This signal is inverted by the inverter 112 so that this signal may be changed into the temperature detection signal detectz at the L level as shown in FIG. 16C.

Further, there has beer proposed a semiconductor device provided with a temperature detection function of optimizing the operating state according to the predetermined detection temperature. (see Japanese Unexamined Patent Publication No. 2003-132678. Further, there has been proposed a temperature detection circuit arranged to calibrate a variety in manufacture, optimize the refresh interval according to the operating temperature, and reduce the power consumption. (see Japanese Unexamined Patent Publication No. 2000-55742.)

As shown in FIG. 12, however, only one reference temperature is provided for changing the interval between the refresh operation. Hence, those circuits involve a shortcoming that a large interval takes place between the data holding time of the DRAM cell and the refresh interval and thus the efficiency of lowering the power consumption is made lower.

SUMMARY OF THE INVENTION

In view of the foregoing, it is an object of the present invention to provide a semiconductor memory device which is arranged to have a plurality of reference temperatures and minutely change the refresh interval according to the compared result between a detected temperature and each of those reference temperatures, for the purpose of reducing the power consumption thereof.

To accomplish the above object, the present invention provides a semiconductor memory device that is arranged to perform a refresh operation for holding data stored therein. The semiconductor memory device include., a temperature detector unit for detecting a temperature and outputting a temperature signal, a reference temperature signal output unit for outputting reference temperatures signals according to a selection signal, the reference temperature signals corresponding to a plurality of difference reference temperatures to be compared with the temperature of the chip, a temperature comparator unit for comparing the detected temperature with the reference temperature through the temperature signal and the reference temperature signal, a selection signal output unit for outputting the selection signal according to the compared result, and a refresh interval control unit for changing the refresh interval according to the compared result.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 9 illustrates relation among a detection temperature signal, a detection temperature latch signal, and a signal state of a node N1.

FIGS. 16A, 16B and 16C are explanatory views of the operation of the temperature detector shown in FIG. 15, in which FIG. 16A shows relation between a reference voltage and a monitor voltage, FIG. 16B shows the output voltage of a differential amplifier composed of transistors, and FIG. 16C shows the voltage of the temperature detection signal.

DESCRIPTION OF THE PREFERRED EMBODIMENTS

Preferred embodiments of the present invention will be described below with reference to the accompany drawings.

Figure 1:
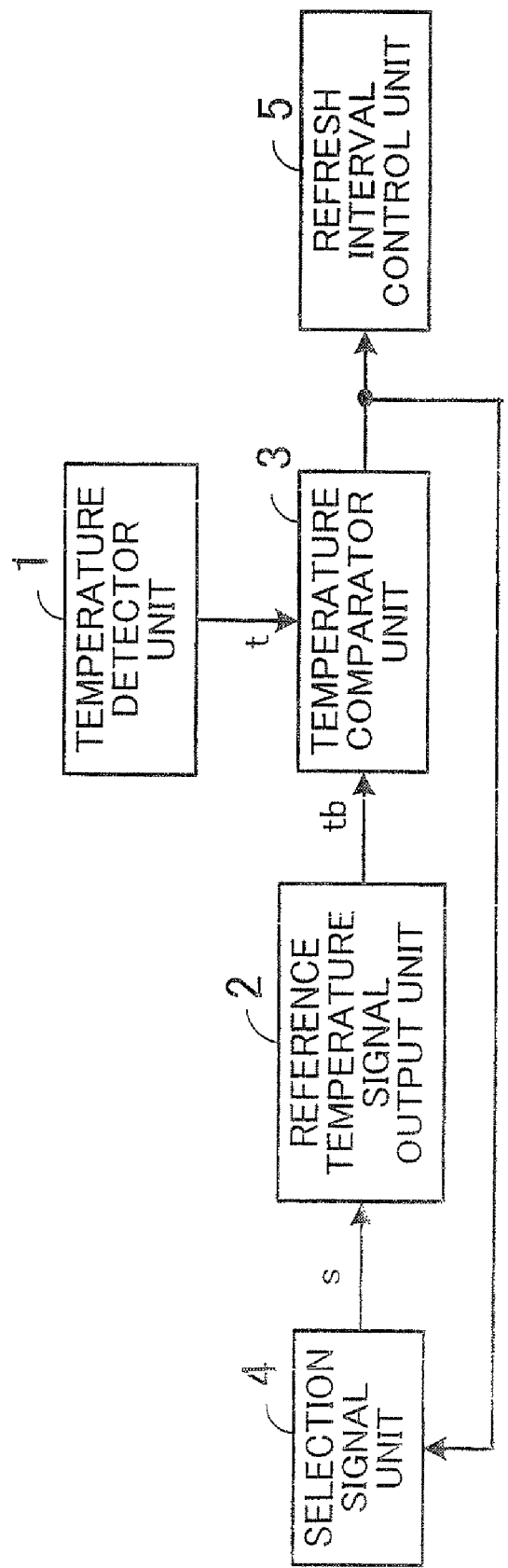
FIG. 1 is a block diagram showing a summary of refresh interval control to be executed in a semiconductor memory device.

FIG. 1 illustrates the summary of the refresh interval control to be executed in the semiconductor memory device. As shown in FIG. 1, the semiconductor memory device includes a temperature detector unit 1, a reference temperature signal output unit 2, a temperature comparator unit 3, a selection signal output unit 4, and a refresh interval control unit 5.

The temperature detector unit 1 detects the temperature of a chip and then outputs a temperature signal t. The reference temperature signal output unit 2 outputs the corresponding reference temperature signal tb with each of different reference temperatures to be compared with the temperature of the chip in response to the selection signal s. The temperature comparator unit 3 compares the temperature of the chip with the reference temperature through the temperature signal t and the reference temperature signal tb.

The selection signal output unit 4 outputs the selection signal s according to the compared result of the temperature comparator unit 3. For example, when the detected chip temperature is lower than the reference temperature, the selection signal output unit 4 selectively outputs the selection signal s so that the reference temperature signal output unit 2 may output the corresponding reference temperature signal tb with the reference temperature being lower by one temperature step (simply referred to as one step). On the other hand, when the detected chip temperature is higher than the reference temperature, the selection signal output unit 4 selectively outputs the selection signal s so that the reference temperature signal output unit 2 may output the corresponding reference temperature signal tb with the reference temperature being higher by one stem.

The refresh interval control unit 5 changes the refresh interval according to the compared result of the temperature comparator unit 3. Since a plurality of reference voltages to be compared by the temperature comparator unit 3 are provided, a plurality of refresh intervals are provided accordingly. Hence, the refresh interval may be changed in detail. In the case of selecting a higher reference temperature, the refresh interval is adjusted to be shorter than the interval provided in the case of selecting the lower reference temperature.

As described above, the reference temperature to be compared with the detected chip temperature may be changed according to the compared result, and the refresh interval may be changed in detail according to the compared result between the changed reference temperature and the detected chip temperature. These changes make it possible to reduce the interval between the data holding time and the refresh interval, thereby being able to reduce the power consumption.

In turn, the embodiments of the present invention will be described in detail with reference to the drawings.

Figure 2:
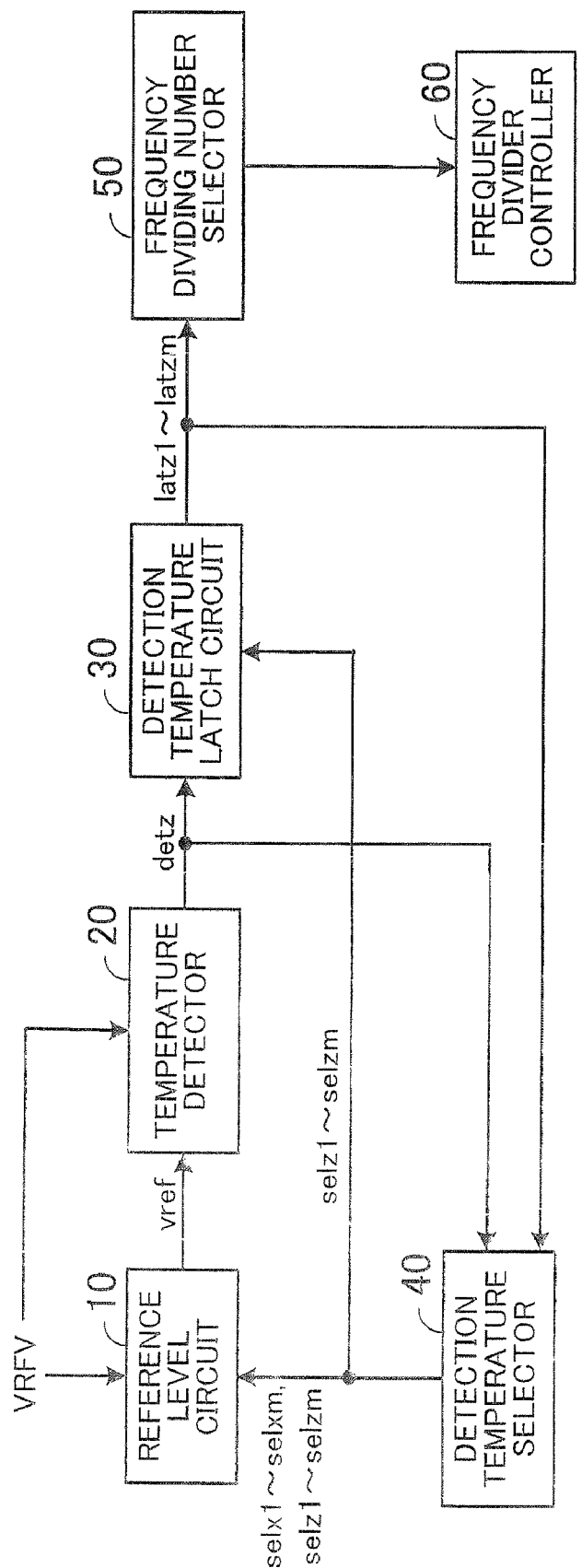
FIG. 2 is a block diagram showing a system arrangement of refresh interval control to be executed in the semiconductor memory device.

FIG. 2 illustrates an exemplary system arrangement of the refresh interval control to be executed in the semiconductor memory device. The kinds of signals to be inputted to and outputted from the circuits will be briefly described with reference to FIG. 2. As shown, the semiconductor memory device includes a reference level circuit 10, a temperature detector 20, a detection temperature latch circuit 30, a detection temperature selector 40, a frequency dividing number selector 50, and e frequency division controller 60. These circuits are formed on the same semiconductor chip Ls the DIP. cell so that those circuits may control the refresh interval of the DRAM cell according to the temperature.

The reference level circuit 10 is supplied, with a voltage VRFV that does not depend upon the variations of the temperature and the power supply. Further, the combination of the reference level circuits 10 is inputted with detection temperature selection signals selx1 to selxm and selz1 to selzm (each group of which has m signals). The detection temperature selection signals selx1 to selxm are paired with the other temperature selection signals selz1 to selzm. For example, when the detection temperature selection signal selx1 is at the H level, the detection temperature selection signal selz1 is at the L level. The reference level circuit 10 generates m reference voltages vref which are different voltages and outputs one reference voltage vref according to the detection temperature selection signals selx1 to selxm and selz1 to selzm.

The temperature detector 20 is inputted with the voltage VRFV and the reference voltage vref outputted from the reference level circuit 10. The temperature detector 20 compares the reference voltage vref with the corresponding monitor voltage vmoni with the chip temperature (the temperature of the DRAM cell) and then outputs the temperature detection signal detz that indicates the compared result to the detection temperature latch circuit 30.

The detection temperature latch circuit 30 is a combination of latch circuits, the number of which is m, which are respectively inputted with temperature detection signals detz outputted from the temperature detector 20. The detection temperature latch circuits 30 are inputted with the detection temperature selection signals selz1 to selzm outputted from the detection temperature selector 40. The detection temperature latch circuit 30 reads the state of the temperature detection signal detz outputted from the temperature detector 20 and outputs the detection temperature latch signal latz to the frequency dividing number selector 50, if the latch circuit is selected by the detection temperature selection signal selz, while the detection temperature latch circuits 30 continue to output the same detection temperature latch signal latz as the signal given in the previous selection if those latch circuits are not selected by the detection temperature selection signal selz.

The detection temperature selector 40 is a combination of selectors, the number of which is m, which number corresponds with the number of the detection temperature latch circuits 30. The detection temperature selector 40 is inputted with the detection temperature latch signal latzn outputted from the corresponding detection temperature latch circuit as well as the detection temperature latch signals latzn-1 and latzn+1 outputted from the detection temperature latch circuits adjacent to the corresponding latch circuit. Further, each detection temperature selector 40 is inputted with the temperature detection signal detz outputted from the temperature detection circuit 20. The detection temperature selectors 40 output the detection temperature selection signals selx1 to selxm and selz1 to selzm according to the inputted detection temperature latch signals latz1 to latzm and the temperature detection signal detz.

The frequency dividing number selector 50 is inputted with the detection temperature latch signals latz1 to latzm outputted from the detection temperature latch circuits 30. The frequency dividing number selector 50 selects the frequency dividing number of a divider (not shown) according to the inputted detection temperature latch signals latz1 to latzm.

The frequency divider controller 60 controls the frequency divider so that the frequency dividing number may be the number selected by the frequency dividing number selector 50. The frequency divider outputs refresh request signals of various intervals under the control of the frequency divider controller 60.

Figure 3:
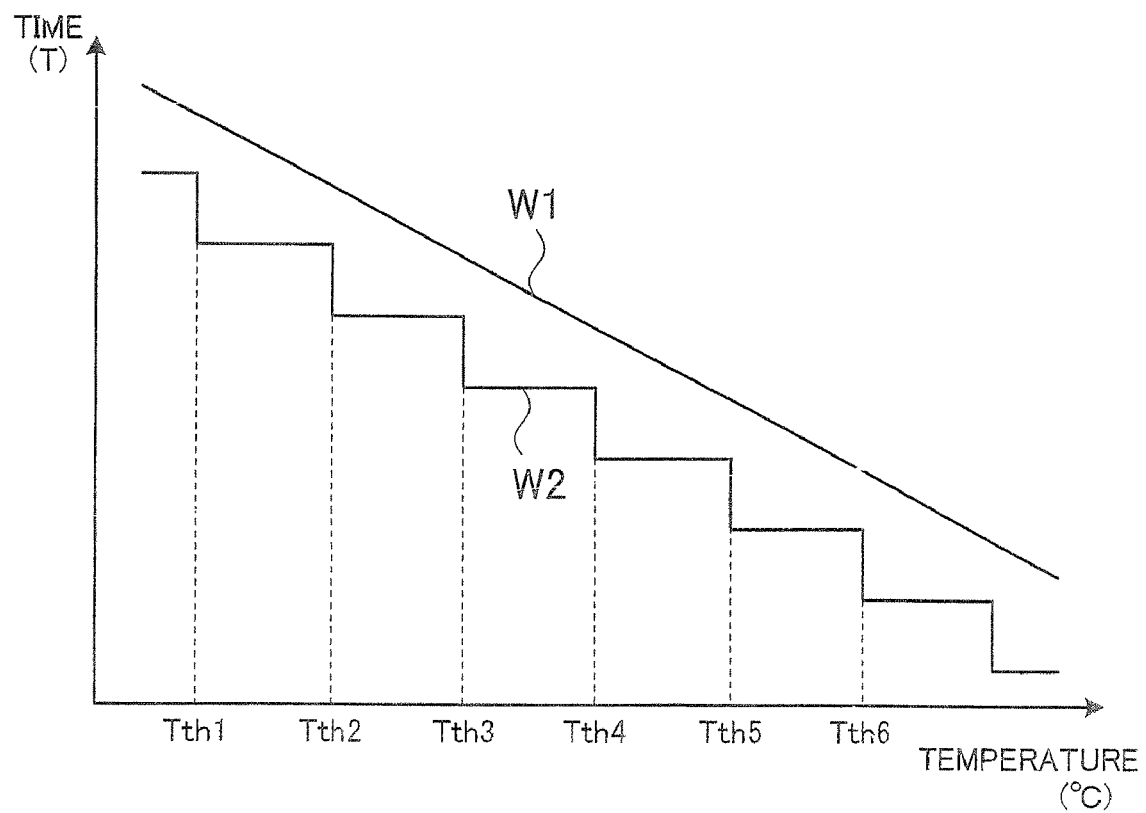
FIG. 3 is a graph showing relation between temperature dependency of a data holding time and a refresh interval time in a DRAM realized by the system shown in FIG. 2.

FIG. 3 illustrates relation between dependency of a data holding time upon a temperature and a refresh interval in a DRAM cell realized by the system shown in FIG. 2. A waveform W1 of FIG. 3 shows a temperature dependency of a data holding time in the DR cell. A waveform W2 shows an interval between a refresh operation of the DRAM cell. In addition, a time on an axis of ordinance is denotes on a log scale.

As shown by the waveform W1, the DRAM cell has a longer data holding time as the temperature becomes lower. In the system of FIG. 2, as shown by the waveform W2, a plurality of detection temperatures (reference temperatures) Tth1 to Tth6 are provided (in the case that m of FIG. 2 is 6). The interval between the refresh operation is specified depending upon if the chip temperature is lower or higher than each of these detection temperatures Tth1 to Tth6.

The detection temperatures Tth1 to Tth6 correspond with the reference voltages vref outputted from the reference level circuit 10 shown in FIG. 2. That is, the interval between the refresh operation is changed depending upon if the chip temperature signal is higher or lower than each of the reference voltages vref (detection temperatures Tth1 to Tth6). By providing a plurality of detection temperatures Tth1 to Tth6 and changing the interval between the refresh operation according to those detection temperatures, the system shown in FIG.

2 makes it possible to reduce the interval between the data holding time and the interval between the refresh operation in the DRAM cell, thereby reducing the power consumption.

In turn, the description will be oriented to the detailed blocks of the system arrangement shown in FIG. 2.

Figure 4:
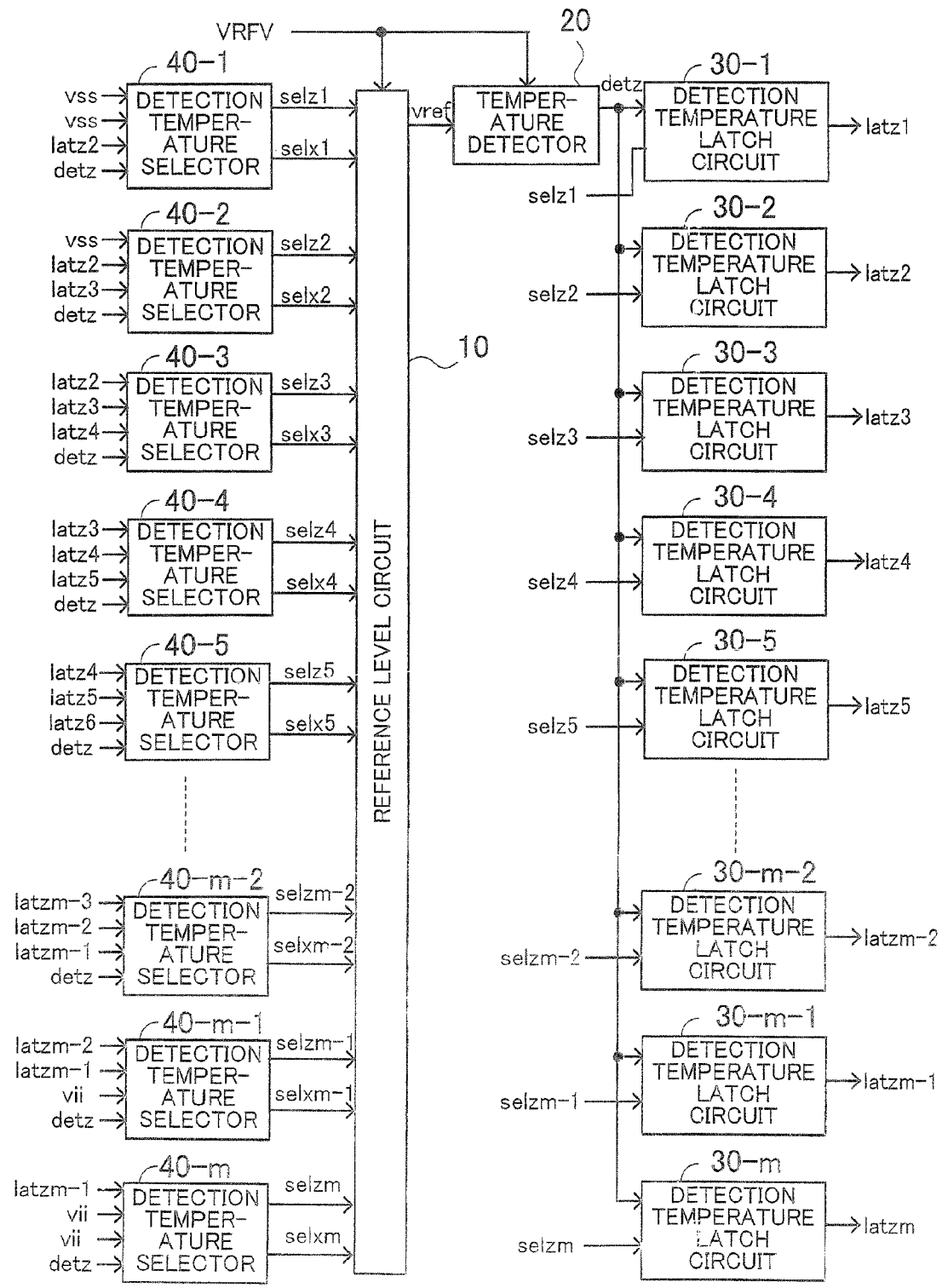
FIG. 4 is a block diagram showing refresh interval control of the semiconductor memory device shown in FIG. 2 in detail.

FIG. 4 shows the detailed blocks of the refresh interval control to be executed by the semiconductor memory device shown in FIG. 2. FIG. 4 illustrates the reference level circuit 10, the temperature detector 20, m detection temperature latch circuits 30-1 to 30-m, and m detection temperature selectors 40-1 to 40-m. The frequency dividing number selector 50 and the frequency divider controller 60 shown in FIG. 2 are not shown in FIG. 4.

The detection temperature selectors 40-1 to 40-m output to the reference level circuit 10, the detection temperature selection signals selx1 to selxm and selz1 to selzm to be used for selecting the detection temperatures (corresponding with the reference voltage vref) having been described in FIG. 3 and output the detection temperature selection signals selz1 to selzm to the detection temperature latch circuits 30-1 to 30-m respectively.

The detection temperature selectors 40-1 to 40-m output the detection temperature selection signals selx1 to selxm and selz1 to selzm so that the next reference voltage vref may be selected depending upon whether or not the chip temperature signal is higher than the currently selected reference voltage vref (corresponding with the detection temperature). For examples when the chip temperature is lower than the corresponding detection temperature with the currently selected reference voltage vref, the detection temperature selectors 40-1 to 40-m output the detection temperature selection signals selx1 to selxm and selz1 to selzm so that the corresponding reference voltage vref with the detection temperature being lower by one temperature step may be selected. On the contrary, when the chip temperature is higher than the corresponding detection temperature with the currently selected reference voltage vref, the detection temperature selectors 40-1 to 40-m output the detection temperature selection signals selx1 to selxm and selz1 to selzm so that the corresponding reference voltage vref with the detection temperature being higher by one temperature step may be selected. The detection temperature selectors 40-1 to 40-m are arranged to output the detection temperature selection signals selx1 to selxm and selz1 to selzm according to the supply voltage vii, the detection temperature latch signals latz1 to latzm, the temperature detection signal detz outputted from the temperature detector 20, and the ground voltage vss. The detection temperature selectors 40-1 to 40-m are provided to correspond with m detection temperatures, respectively. The detection temperature selector 40-1 corresponds with the lowest detection temperature and the detection temperature selector 40-m corresponds with the highest detection temperature.

The reference level circuit 10 operates to output to the temperature detector 20 the m reference voltages according to the detection temperature selection signals selx1 to seize and selz1 to selzm. For example, when the reference level circuit 10 is inputted with the detection temperature selection signal selx1 at the L level and the detection temperature selection signal selz1 at the H level, the reference level circuit 10 outputs the highest reference voltage vref. On the contrary, when the reference level circuit 10 is inputted with the detection temperature selection signal selx2 at the L level and the detection temperature selection signal selz2 at the H level, the reference level circuit 10 outputs the next highest reference voltage vref to the foregoing reference voltage vref. When the reference level circuit 10 is inputted with the detection temperature selection signal selxm at the L level and the detection temperature selection signal selzm at the H level, the reference level circuit 10 outputs the lowest reference voltage vref.

The temperature detector 20 compares the reference voltage vref outputted from the reference level circuit 10, that is, the selected detection temperature with the temperature of the chip and then outputs the compared result, that is, the temperature detection signal detz to the detection temperature latch circuits 30-1 to 30-m and the detection temperature selectors 40-1 to 40-m. For example, when the chip temperature is lower than the selected detection temperature, the temperature detector 20 outputs the temperature detection signal detz at the L level. On the contrary, when the chip temperature is higher than the selected detection temperature, the temperature detector 20 outputs the temperature detection signal detz at the H level. The detection temperature to be selected next is determined on the state of this temperature detection signal detz. For example, when the temperature detector 20 outputs the temperature detection signal detz at the L level, the detection temperature being lower by one temperature step than the currently selected detection temperature is selected, while when the temperature detector 20 outputs the temperature detection signal detz at the H level, the detection temperature being higher by one temperature step than the currently selected detection temperature is selected.

The detection temperature latch circuits 30-1 to 30-m are inputted with the temperature detection signal detz outputted from the temperature detector 20 and the detection temperature selection signals selz1 to selzm outputted from the detection temperature selectors 40-1 to 40-m respectively. When the detection temperature selection signals selz1 to selzm at the H level are inputted, the detection temperature latch circuits 30-1 to 30-n accept the temperature detection signal detz outputted from the temperature detection circuit 20 and thereby output the detection temperature latch signals latz1 to latzm. When the detection temperature selection signals selz1 to selzm at the L level are inputted, the detection temperature latch circuits 30-1 to 30-m output. the detection temperature latch signals latz1 to latzm derived when the signals selz1 to selzm were at the H level in the previous time. In addition, like the detection temperature selectors 40-1 to 40-m, the detection temperature latch circuits 30-1 to 30-m correspond with m detection temperatures respectively. Further, the detection temperature latch circuits 30-1 to 30-m operate to latch the temperature detection signal detz being inverted.

In the meantime, the system is arranged so that when the power is turned on, the highest detection temperature may be selected for making the interval between the refresh operation shortest. Hence, when the system is started like a turn-on, all the detection temperature latch circuits 30-1 to 30-m output the detection temperature latch signals latz1 to latzm at the L level and the detection temperature selector 40-m outputs the detection temperature selection signal selzm at the H level and the detection temperature selection signal selxm at the L level. (In the other selectors, conversely, the signal selzm is at the L level and the signal sells is at the H level). This causes the detection temperature latch circuit 30-m to latch the temperature detection signal detz, which corresponds to the result of comparison between the highest detection temperature and the chip temperature, the result being outputted from the temperature detector 20. When the chip temperature is lower than the current detection temperature, the temperature detector 20 is caused to output the temperature detection signal detz at the L level for lowering the current detection temperature by one step. The detection temperature latch circuit 30-m is caused to output the detection temperature latch signal latzm at the H level that is a reversed signal of the temperature detection signal detz at the L level.

When the detection temperature 20-1 to 30-m latch circuits output the detection temperature latch signals latz1 to latzm-1 at the L level and the detection temperature latch signal latzm at the H level, the detection temperature selector 40-m-1 is activated (to be discussed later in detail). This causes the next highest detection temperature (reference voltage vref) to be selected. Further, the detection temperature selector 40-m-1 outputs the detection temperature selection signal selzm-1 at the H level and the detection temperature latch circuit 30-m-1 latches the temperature detection signal detz, which corresponds to the result of comparison between the next highest detection temperature and the chip temperature, the result being outputted from the temperature detector 20. When the chip temperature is lower than the current detection temperature, the temperature detection signal detz at the L level is outputted by the temperature detector 20, for lowering the current detection temperature by one step, and the detection temperature latch circuit 30-m-1 outputs the detection temperature latch signal latzm-1 at the H level. The output of the detection temperature latch signals latz1 to latzm-2 at the L level and the detection temperature latch signals latzm-1 and latzm at the H level causes the detection temperature selector 40-m-2 to be activated (to be discussed later in detail). Similarly, when the chip temperature is lower than the detection temperature, the border between the H level and the L level of the detection temperature latch signal latz1 to latzm is shifted upward in FIG. 4 from the detection temperature latch signal latzm-2 to latzm-3, . . . , which results in making the area at the H level larger. On the other hand, when the chip temperature is higher than the detection temperature, the border between the H level and the L level of the detection temperature latch signal latz1 to latzm is shifted downward in FIG. 4, which results in making the area at the H level smaller. This causes the detection temperature to be varied.

In turn, the description will be oriented to each circuit shown in FIG. 4. At first, the detailed arrangement of the reference level circuit 10 will be described.

Figure 5:
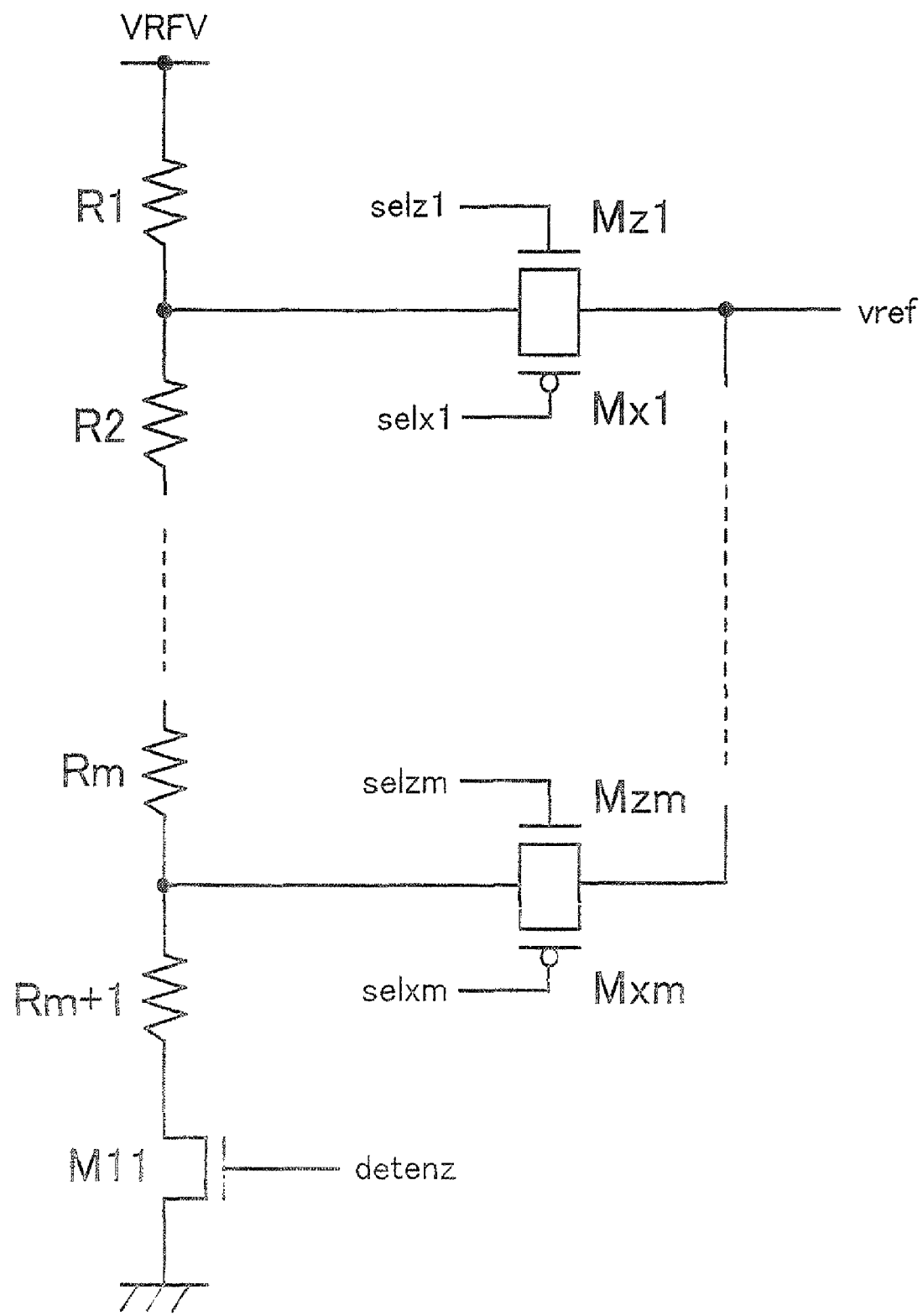
FIG. 5 is a circuit diagram showing a reference level circuit in detail.

FIG. 5 shows the details of the reference level circuit. As shown, the reference level circuit 10 is composed of (m+1) resistors R1 to Rm+1, m NMOS transistors Mz1 to Mzm, m PMOS transistors Mx1 to Mxm, and an NMOS transistor M11.

The resistors R1 to Rm+1 and the transistor M11 are connected in series between the voltage VRFV, which does not depend upon the variations of the temperature and the power supply, and the ground. The gate of the transistor M11 is inputted with a temperature detection enable signal detenz (to be discussed below) though the signal is not shown. When the gate of the transistor M11 is inputted with the enable signal detenz at the H level, the voltage VRFV is divided by the resistors R1 to Rm+1.

The transistors Mz1 to Mzm and Mx1 to Mxm compose the transfer gate. The gates of the transistors Mz1 to Mxm are inputted with the detection temperature selection signals selz1 to selzm and the gates of the transistors Mz1 to Mxm are inputted with the detection temperature selection signals selx1 to selxm.

Each transfer gate composed of the transistors Mz1 to Mzm and Mx1 to Mxm is inputted with the voltage VRFV divided by the resistors R1 to Rm+1. When the transfer gate is inputted with one of the detection temperature selection signals selz1 to selzm at the H level and one of the detection temperature selection signals selx1 to selxm at the L level, the transfer gate selected bas the detection temperature selection signals outputs the voltage VRFV divided by the resistors R1 to Rm+1 as the reference voltage vref.

In turn, the temperature detector 20 will be described in detail.

Figure 6:
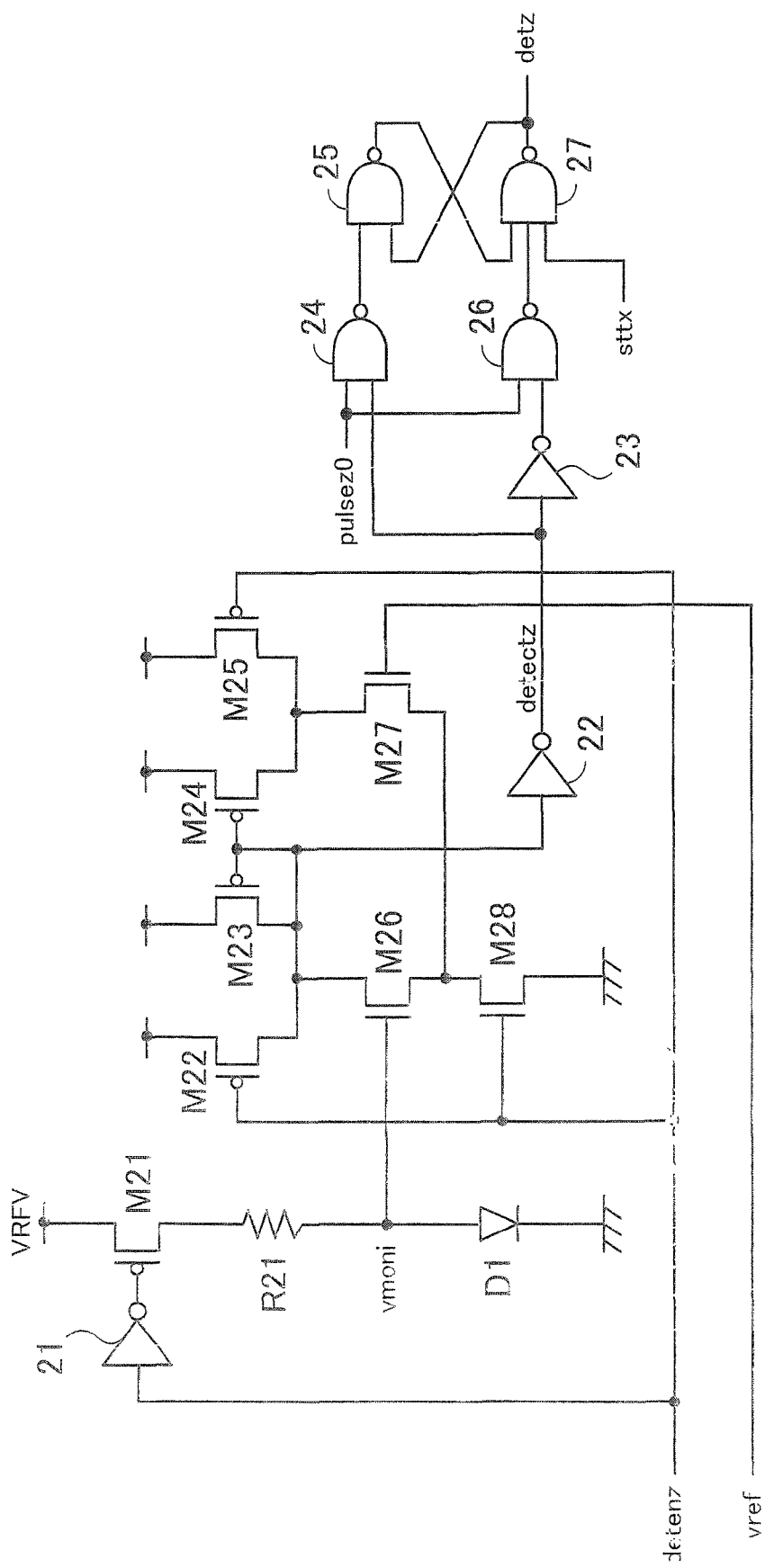
FIG. 6 is a circuit diagram showing a temperature detector in detail.

FIG. 6 shows the details of the temperature detector. As shown, the temperature detector 20 is composed of inverters 21 to 23, NAND circuits 24 to 27, PMOS transistors M21 to M25, NMOS transistors M26 to M28, a resistor R21, and a diode D1.

The transistor M21, the resistor R21 and the diode D1 are connected in series between the voltage VRFV, which does not depend upon the variations of the temperature and the power supply, and the ground. The gate of the transistor M21 is inputted with the temperature detection enable signal detenz through the inverter 21. When the inverter 21 is inputted with the temperature detection enable signal detenz at the H level, the transistor M21 is turned on, so that the voltage VRFV may be applied into the diode D1 through the resistor R21.

The threshold value of the diode D1 is varied depending upon the temperature. Concretely, when the chip temperature becomes higher, the threshold value becomes lower. That is, the voltage generated in the anode of the diode DI represents the chip temperature and is inputted as the monitor voltage vmoni into the gate of the transistor M26.

The transistors M23, M24, M26, M27 and M26 compose a differential amplifier, The gates of the transistors M26 and M27 are inputted with the monitor voltage vmoni and the reference voltage vref. The differential amplifier outputs the result of comparison between the monitor voltage vmoni and the reference voltage vref to the inverter 22. When the monitor voltage vmoni is higher than the reference voltage vref, that is, when the chip temperature is lower than the detection temperature, the inverter 22 is caused to output the signal at the H level. On the contrary, when the monitor voltage vmoni is lower than the reference voltage vref, that is, when the chip temperature is higher than the detection temperature, the inverter 22 is caused to output the signal at the L level.

The gates of the transistors M22, M25 and M28 are inputted with the temperature detection enable signal detenz. When the enable signal is at the H level, the transistors M22 and M25 are turned off and the transistor M28 is turned on, which causes the differential amplifier to be started. When the enable signal is at the L level, the transistors M22 and M25 are turned on and the drains of the transistors M26 and M27 are fixed to the supply voltage. Further, the transistor M28 is turned off, which causes the differential amplifier to be inoperative.

The inverter 23 and the NAND circuits 24 to 27 compose the latch circuit. The NAND circuit 24 is inputted with a pulse signal pulsez0 (to be discussed below), The NAND circuit 27 is inputted with a starter signal sttx. The latch circuit composed of the inverter 23 and the NAND circuits 24 to 27 inverts the signal outputted from the inverter 22 and latches the inverted signal in response to the pulse signal pulsez0 at the H level and the starter signal sttx, and then outputs the latched signal as the temperature detection signal detz. Hence, when the chip temperature is lower than the detection temperature, the latch circuit outputs the temperature detection signal detz at the L level. On the contrary, when the chip temperature is higher than the detection temperature, the latch circuit outputs the temperature detection signal detz at the H level. In the start time, the temperature detection signal detz is made to be at the H level in response to the starter signal sttx at the L level.

In turn, the detection temperature latch circuits 30-1 to 30-m will be described in detail.

Figure 7:
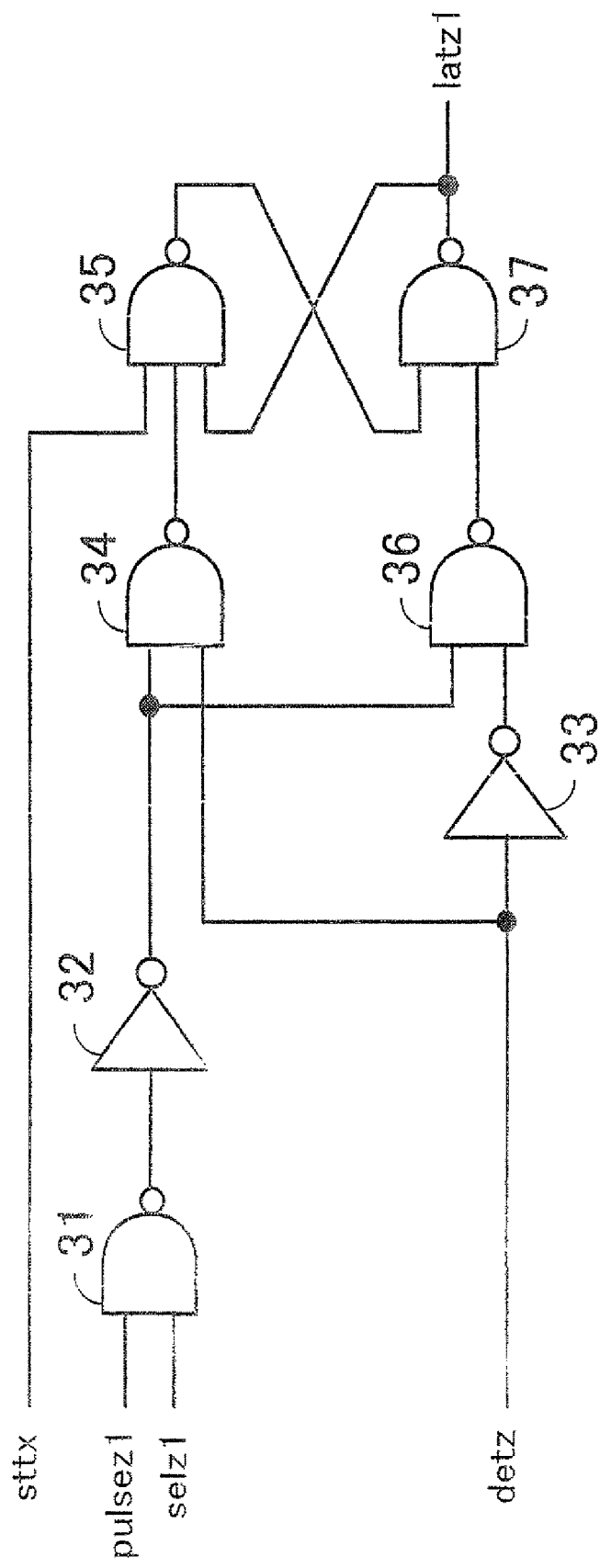
FIG. 7 is a circuit diagram showing a detection temperature latch circuit in detail.

FIG. 7 shows the details of -he detection temperature latch circuit. Each of the detection temperature latch circuits 30-1 to 30-m has the same circuit arrangement. Hence, the description will be oriented only to the latch circuit 30-1.

As shown in FIG. 7, the latch circuit 30-1 is composed of NAND circuits 31, 34 to 37 and inverters 32 and 33. The inverters 33 and the NAND circuits 34 to 37 compose the latch circuit. The NAND circuit 34 of this latch circuit is inputted with the pulse signal pulsez1 and the detection temperature selection signal selz1 through the NAND circuit 31 and the inverter 32. The NAND circuit 35 is inputted with the starter signal sttx. The inverter 33 is inputted with the temperature detection signal detz. When the latch circuit is inputted with the pulse signal pulsez1 at the H level, the detection temperature selection signal selz1 and the starter signal sttx, the latch circuit inverts the temperature detection signal detz and latches the inverted signal, and then outputs the inverted signal as the detection temperature latch signal latz1. The latch circuits 30-2 to 30-m are inputted with the detection temperature selection signals selz2 to selzm respectively and then output the detection temperature latch signals latz2 to latzm. Further, in the start time, the latch circuits 30-1 to 30-m are inputted with the starter signal sttx at the L level and then output the detection temperature latch s latz1 to latzm at the L level.

Next, the detection temperature selectors 40-1 to 40-m will be described in detail.

Figure 8:
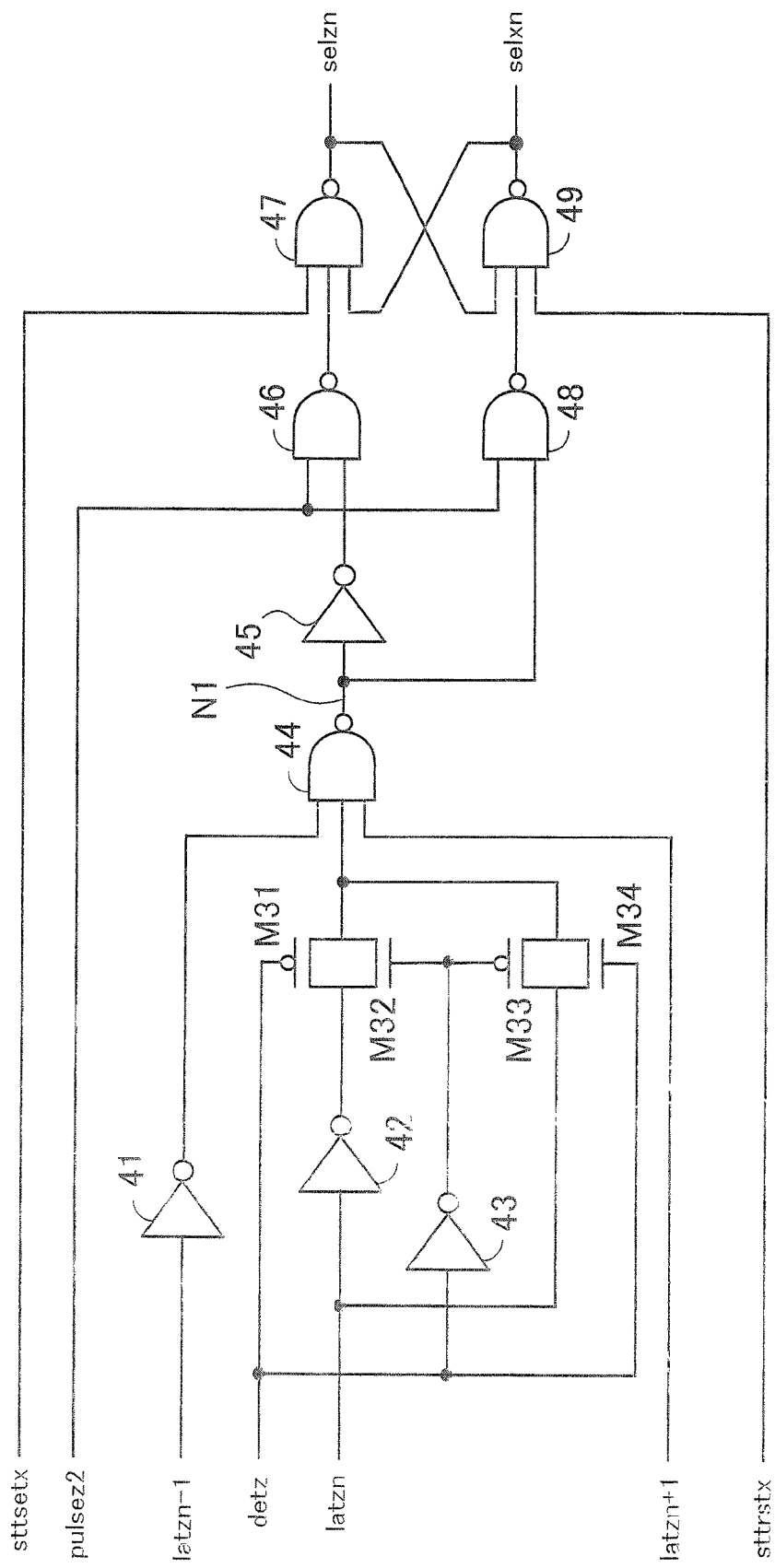
FIG. 8 is a circuit diagram showing a detection temperature selector in detail.

FIG. 8 shows the details of the detection temperature selector. The n-th selector 40n of m selectors is shown in FIG. 8. As shown, the detection temperature selector 40n is composed of inverters 41 to 43, 45, NAND circuits 44, 46 to 49, PMOS transistors M321 and M33, and NMOS transistors M32 and M34.

The inverters 41 to 43, the PMOS transistors M31 and M33, the NMOS transistors M32 and M33, and the NAND circuit 44 are caused to output to a node N1 a signal of a predetermined state according to the signal states of the temperature detection signal detz and the detection temperature latch signals latzn−1, latzn and latzn+1. The inverter 45 and the NAND circuits 46 to 49 latch the signal state of the node N1 and output the detection temperature selection signal selxn to selzn according to the latched signal. That is, the detection temperature selector 40n is caused to output the detection temperature selection signals selzn and selxn according to the temperature detection signal detz, the detection temperature latch signal latzn−1 inputted into the selector 40n−1 adjacent to the selector 40n, the detection temperature latch signal latzn inputted for the selector 40n itself, and the detection temperature latch signal latzn+1 inputted into the selector 40n+1 adjacent to the selector 40n.

Herein, the description will be oriented to relation of the signal state among the temperature detection signal detz, the detection temperature latch signals latzn−1, latzn and latzn+1, and the node N1.

FIG. 9 shows the relation of a signal state among the temperature detection signal, the detection temperature latch signal, and the node N1. As shown, when the temperature detection signal detz is zero (0), if the detection temperature latch signals latzn−1, latzn and latzn+1 are 0 (L level), 0 and 1 (H level), the node N1 is 0 and the detection temperature selection signals selzn and selxn are 1 and 0. In the other combination of the detection temperature latch signals latzn−1, latzn and latzn+1, the node N1 is 1 and the detection temperature selection signals selzn and selxn are 0 and 1. That is, in the case of outputting the temperature detection signal detz of 0, the detection temperature selector 40n being inputted with the detection temperature latch signals latzn−1, latzn and latzn+1 of 0, 0 and 1 is activated so as to select the corresponding detection temperatures (to output the detection temperature selection signals selzn and selxn of 1 and 0).

On the other hand, in a case that the temperature detection signal detz is 1, if the detection temperature latch signals latzn−1, latzn and latzn+1 are 0, 1 and 1 as shown, the node N1 is 0 and the detection temperature selection signals selzn and selxn are 1 and 0. In the other combination of the detection temperature latch signals latzn−1, latzn and latzn+1, the node N1 is 1 and the detection temperature selection signals selzn and selxn are 0 and 1. That is, in the case of outputting the temperature detection signal detz of 1, the detection temperature selector 40n being inputted with the detection temperature latch signals latzn−1, latzn and latzn+1 of 0, 1 and 1 is activated so as to select the corresponding detection temperatures.

That is the corresponding detection temperature selector 40k & 40l with one of the detection temperature latch signals latzk and latz1, adjacent to the border between the L level area and the H level area into which each of the detection temperature latch signals latz1 to latzm is separated, is selected according to the state of the temperature detection signal detz. This causes the border between the L level and the H level of each of the detection temperature latch signals latz1 to latzm to be moved one by one.

Turning back to the description about FIG. 8, the NAND circuits 46 and 48 composing the latch circuit are inputted with the pulse signal pulsez2. The NAND circuit 47 composing the latch circuit is inputted with the starter set signal sttsetx. The NAND circuit 49 composing the latch circuit is inputted with the starter reset signal sttrstx. When the pulse signal pulsez2, the starter set signal sttsetx and the starter reset signal sttrstx are at the H level, the latch circuit latches the signal of the node N1 and then outputs the signal. In the start time, in each of the detection temperature selectors 40-1 to 40-m−1, the starter set signal sttsetx is at the H level and the starter reset signal sttrstx is at the L level. This causes the detection temperature selectors 40-1 to 40-m−1 to output the detection temperature selection signals selz1 to selzm-1 at the L level and the detection temperature selection signals selx1 to selxm-1 at the H level. Further, in the detection temperature selector 40-m, the starter set signal sttsetx is at the L level and the starter reset signal sttrstx is at the H level. This causes the detection temperature selector 40-m to output the detection temperature selection signal selzm at the H level and the detection temperature selection signal selxm at the L level.

The corresponding portions with the detection temperature latch signals latzn−1, latzn and latzn+1 of the detection temperature selector 40-1 are inputted with the ground voltage vss, the voltage vss and the detection temperature latch signal latz2 respectively. Since there is located no corresponding detection temperature selector with the lower detection temperature than that of the detection temperature selector 40-1, the portions of the detection temperature latch signals latzn-1 and latzn are forcibly put into the L level. Further, the corresponding portions of the detection temperature selector 40-m with the detection temperature latch signals latzn−1, latzn and latzn+1 are inputted with the detection temperature latch signals latzm−1, the supply voltage Vii and the voltage Vii respectively. Since there is located no corresponding detection temperature selector with the higher detection temperature than that of the detection temperature selector 40-m, the portions of the detection temperature latch signals latzn and latzn+1 are forcibly put into the H level.

In turn, the description will be oriented to the control signals of the temperature detection enable signal detenz and the pulse signals pulsez0 to pulsez2.

Figure 10:
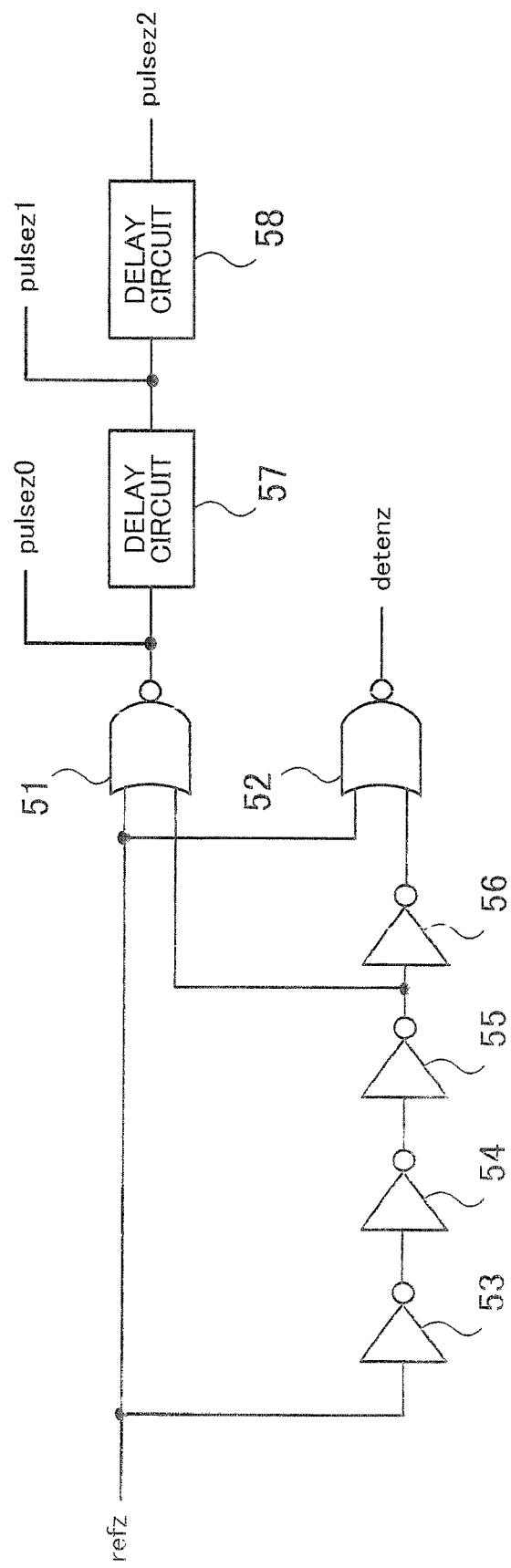
FIG. 10 is a circuit diagram showing a control signal generator.

FIG. 10 is a circuit diagram showing a control signal generator. As shown, the control signal generator includes NOR circuits 51 and 52, inverters 53 to 56 and delay circuits 57 and 58.

One inputs of the NOR circuits 51 and 52 are inputted with a refresh status signal refz that is a periodic pulse signal. The other input of the NOR circuit 51 is inputted with the refresh status signal refz through the inverters 53 to 55 located at three stages. The other input of the NOR circuit 52 is inputted with the refresh status signal refz through the inverters 53 to 56 located at four stages. These signals cause the NOR circuit 51 to output the pulse signal pulsez0 when the refresh status signal refz is shifted from the H level to the L level. Further, while at least one of the refresh status signal refz and the pulse signal pulsez0 is at the H level, the temperature detection enable signal detenz at the H level is outputted from the NOR circuit 52. The pulse signal pulsez0 is delayed by the delay circuits 57 and 58 for generating the pulse signals pulsez1 and pulsez2. In addition, any signal may be inputted into one of the NOR circuits 51 and 52 if it is a periodic signal. The refresh status signal refz is not required to be inputted into one of the NOR circuits 51 and 52.

Hereafter, the operation shown in FIG. 4 will be described. For example, it is assumed that the detection temperature latch signals latz2, latz3, latz4, latz5 and latz6 are at the L, L, L, H and H lintels respectively and the detection temperature selection signal selz4 is at the H level. Assuming that the temperature detection signal detz is at the L level, that is, the detection temperature is required to be lower by one step, the corresponding detection temperature latch circuit 30-4 with the detection temperature selection signal selz4 is caused to output the reversed one of the temperature detection signal detz at the L level, that is, the detection temperature latch signal latz4 at the H level. This causes the detection temperature latch signals latz2, latz3, latz4, latz5 and latz6 to be at the L, L, H, H and H levels respectively. As a result, the temperature detection signal detz is put into the L level. Hence, the detection temperature selection signal selz3 of n=3 is put into the H level, in which signal selz3 of n=3 the detection temperature latch signals latzn−1, latzn and latzn+1 are at the L, L and H levels (0, 0, 1). The detection temperature selection signal selz3 at the H level causes the reference level circuit 10 to output the corresponding reference voltage vref with the detection temperature being lower by one step.

As another example, it is assumed that the detection temperature latch signals latz2, latz3, latz4, latz5 and latz6 are at the L, L, H, H and H levels respectively and the detection temperature selection signal selz4 is at the H level. Assuming that the temperature detection signal detz is at the H level, that is, the detection temperature is required to be higher by one step, the corresponding detection temperature latch circuit 30-4 with the detection temperature selection signal selz4 is caused to output the reversed one of the temperature detection signal detz at the H level, that is, the detection temperature latch signal latz4 at the L level, thereby causing the detection temperature latch signals latz2, latz3, latz4, latz5 and latz6 to be put into the L, L, L, H and H levels respectively. As a result, the temperature detection signal detz is at the H level. Hence, the detection temperature selection signal selz5 of n=5 is put into the H level, in which signal selz5 of n =5 the detection temperature latch signals latzn−1, latzn and latzn+1 are at the L, H and H levels (0, 1, 1) This detection temperature selection signal selz5 at the H level causes the reference level circuit 10 to output the corresponding reference voltage vref with the detection temperature being higher by one step.

In turn, the description will be oriented to the operation shown in FIG. 4 with reference to the timing chart.

Figure 11:
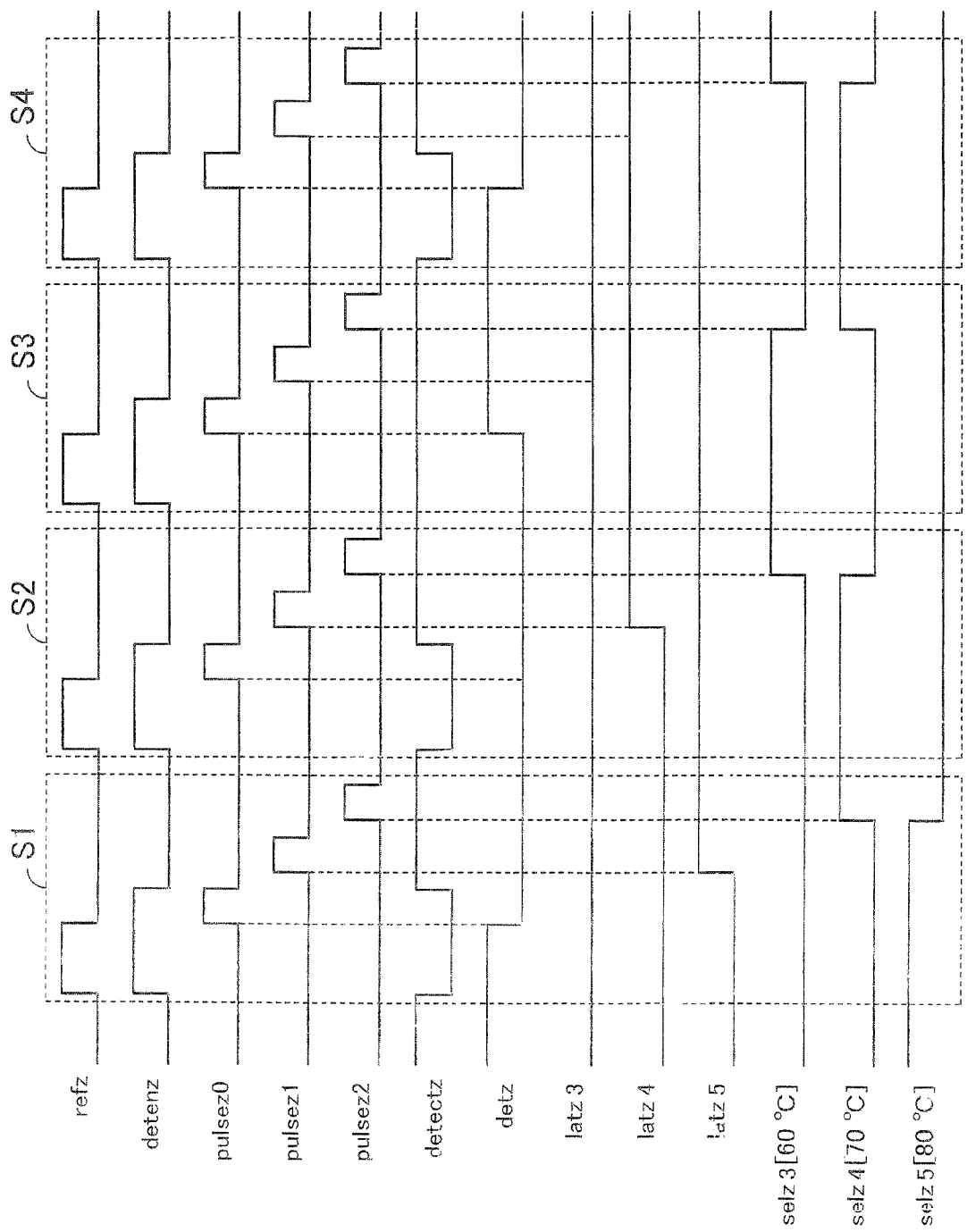
FIG. 11 is a timing chart of FIG. 4.
Figure 12:
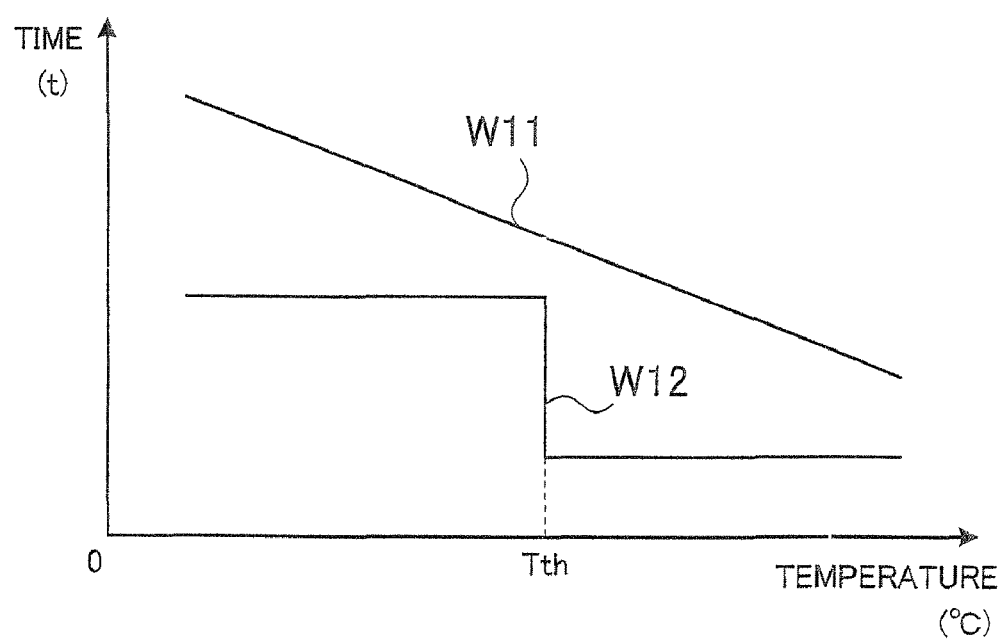
FIG. 12 is a chart showing relation between a data holding time and a temperature.
Figure 13:
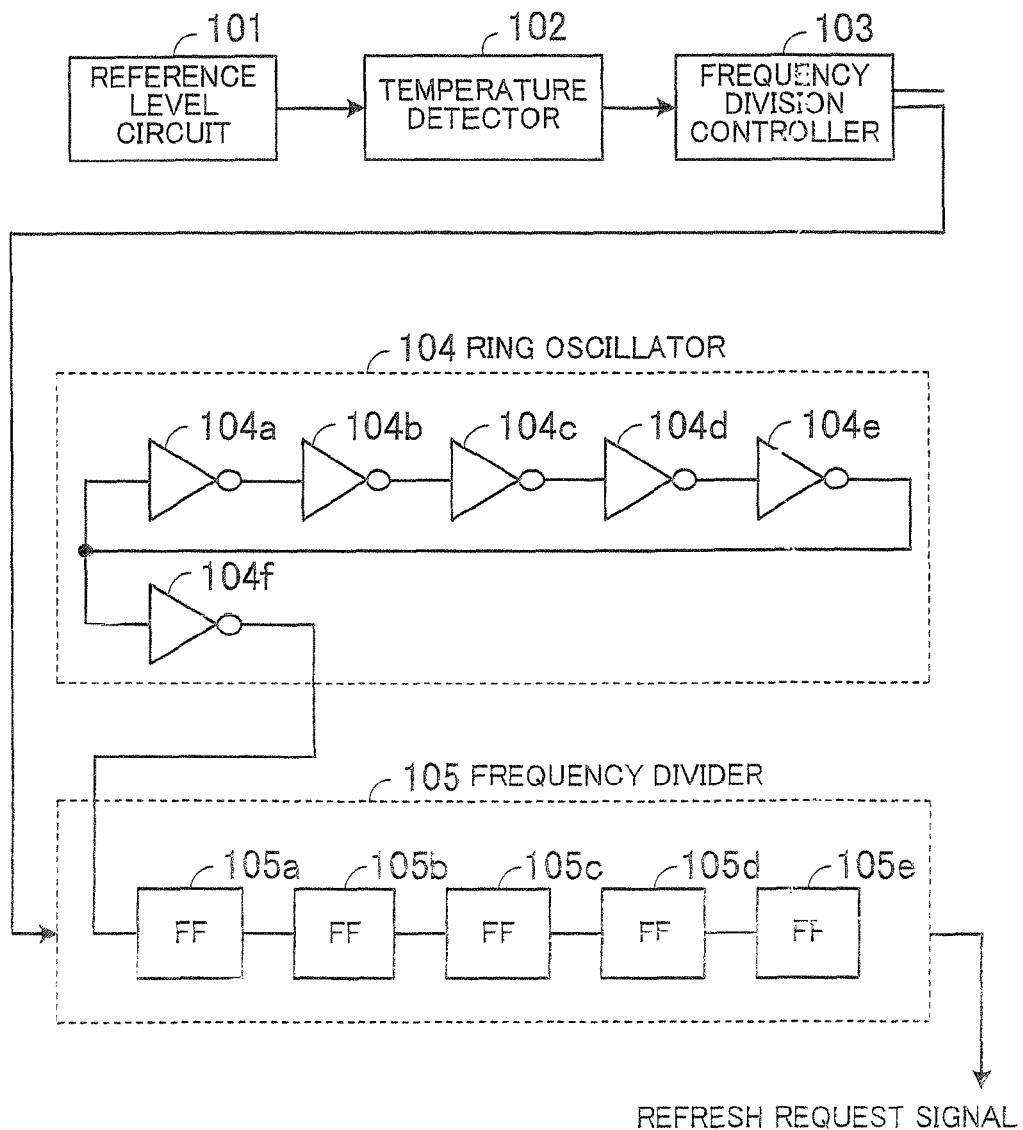
FIG. 13 is a block diagram showing a control circuit for controlling an interval between the refresh operation shown in FIG. 12.
Figure 14:
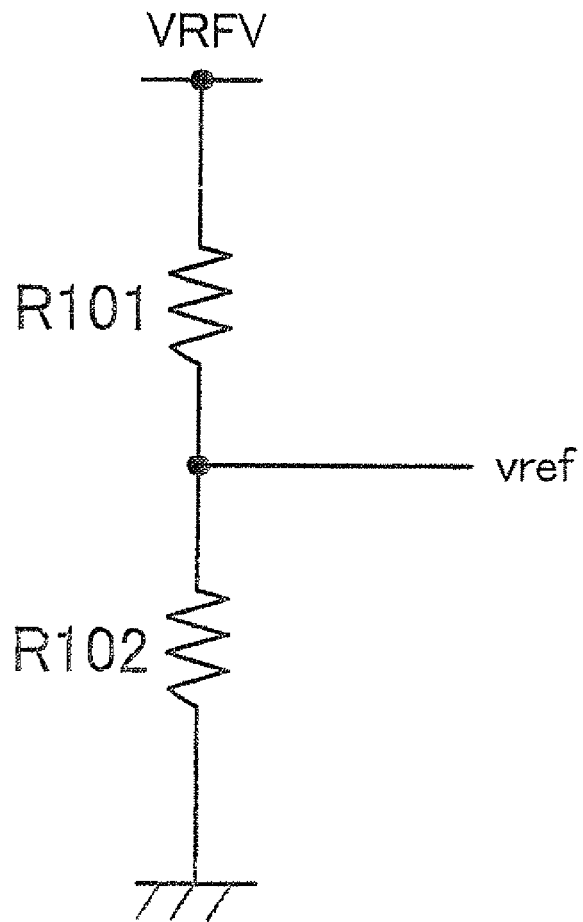
FIG. 14 is a circuit diagram showing a reference level circuit shown in FIG. 13.
Figure 15:
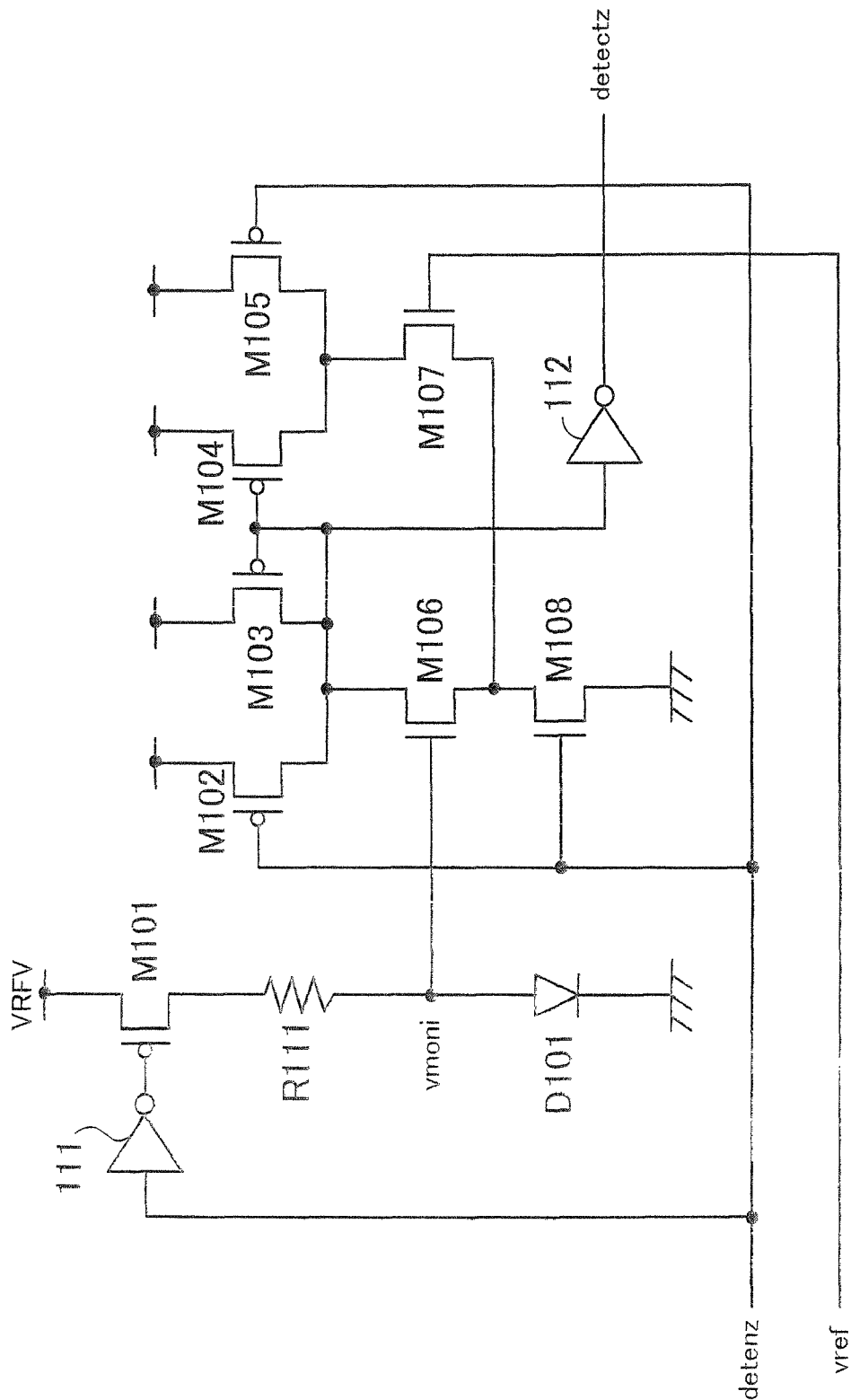
FIG. 15 is a circuit diagram showing a temperature detector shown in FIG. 13.
Figure 16A:
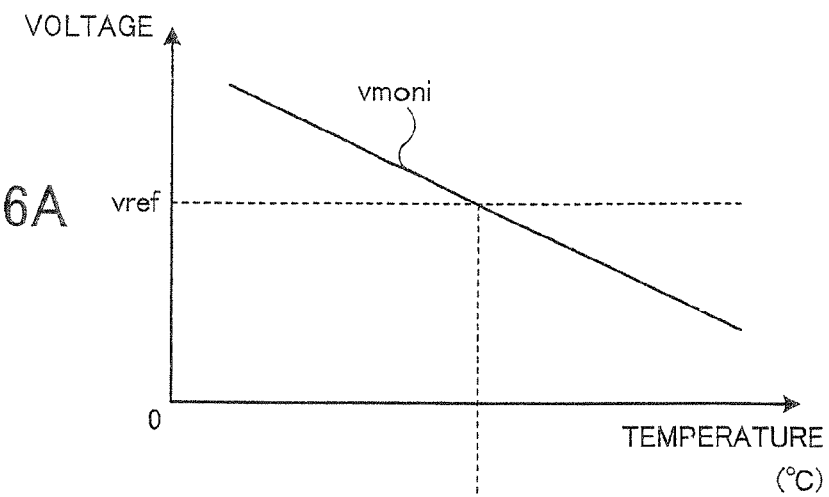
Figure 16B:
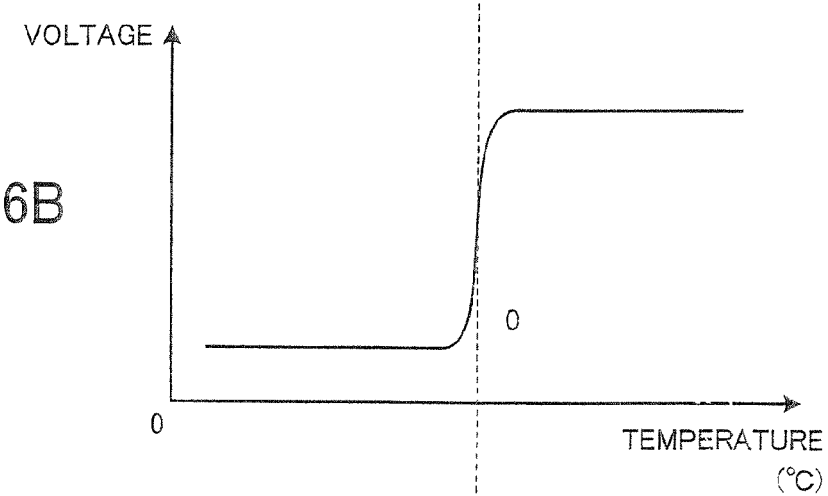
Figure 16C:
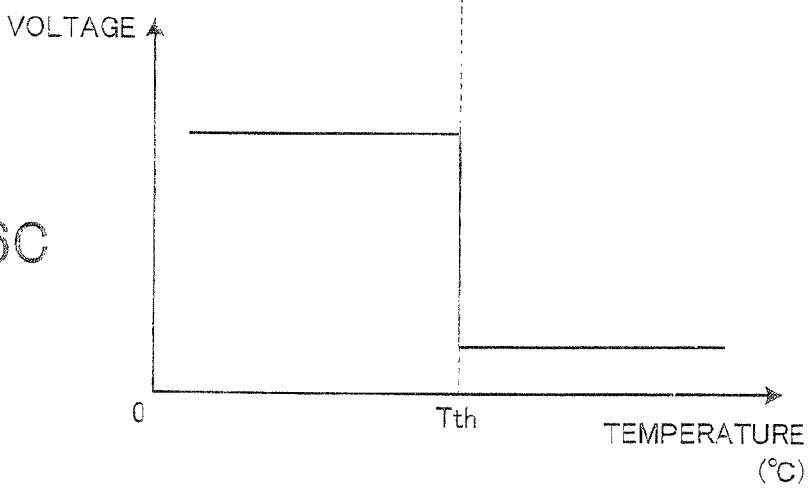

FIG. 11 is a timing chart of the arrangement shown in FIG. 4. It is assumed that the detection temperature selected by the detection temperature selection signal selz3 is 60 degrees, the detection temperature selected by the detection temperature selection signal selz4 is 70 degrees, the detection temperature selected by the detection temperature selection signal selz5 is 80 degrees, and the chip temperature is 65 degrees.

In the interval S1 shown in FIG. 11, when the temperature detection enable signal detenz is put into the H level, the reference level circuit 10 is enabled. Since the detection temperature selection signal selz5 is at the H level, the reference level circuit 10 outputs the corresponding reference voltage vref with the detection temperature of 80 degrees.

The temperature detector 20 is also enabled when the enable signal detenz is at the H level. The temperature detector 20 compares the corresponding reference voltage vref with the detection temperature of 80 degrees with the corresponding monitor voltage vmoni with the chip temperature and then latches the compared result, that is, the temperature detection signal detz by an input of the pulse signal plusez0. Since the chip temperature is 65 degrees, and the selected detection temperature is 80 degrees, the temperature detector 20 outputs the temperature detection signal detz at the L level.

The temperature detection signal detz at the L level is inverted and latched by the detection temperature latch circuit 30-5 when the detection temperature selection signal selz 5 is at the H level. This causes the detection temperature latch signal latz5 at the H level to be outputted, so that the detection temperature latch signals latz3, latz4 and latz5 are put into the L, the L and the H levels respectively.

Since the temperature detection signal detz is at the L level, the detection temperature selector 40-4, by which the detection temperature latch signals latzn−1, latzn and latzn+1 are put into the L, the L and the H levels respectively, is activated. The detection temperature selector 40-4 is caused to output the detection temperature selection signal selz4 at the H level by an input of the pulse signal pulsez2. This causes the detection temperature to be switched from 80 degrees to 70 degrees.

In the interval S2 shown in FIG. 11, when the temperature detection enable signal detenz is put into the H level, the reference level circuit 10 is enabled. Currently, since the detection temperature selection signal selz4 is at the H level, the reference level circuit 10 outputs the corresponding reference voltage vref with the detection temperature of 70 degrees The temperature detector 20 is also enabled when the temperature detection enable signal detenz is at the E level. The temperature detector 20 compares the corresponding reference voltage vref with the detection temperature of 70 degrees with the corresponding monitor voltage vmoni with the chip temperature and then latches the compared result, that is, the temperature detection signal detz by an input of the pulse signal plusez0. Further, since the chip temperature is 65 degrees and the selected detection temperature is 70 degrees, the temperature detector 20 outputs the temperature detection signal detz at the L level.

When the detection temperature selection signal selz4 is at the H level, the temperature detection signal detz at the L level is inverted and latched by the detection temperature latch circuit 30-4. This causes the detection temperature latch signal latz4 at the H level to 10 be outputted, so that the detection temperature latch signals latz3, latz4 and latz5 are put into the L, the H and the H levels respectively.

Since the temperature detection signal detz is at the L level, the detection temperature selector 40-3, by which the detection temperature latch signals latzn−1, latzn and latzn+1 are put into the L, the L and the H levels, is activated. The detection temperature selector 40-3 outputs the detection temperature selection signal selz3 at the H level by an input of the pulse signal pulsez2. This causes the detection temperature to be switched from 70 to 60 degrees.

In the interval S3 shown in FIG. 11, when the temperature detection enable signal detenz is put into the H level, the reference level circuit 10 is enabled. Currently, since the detection temperature selection signal selz3 is at the H level, the reference level circuit 10 outputs the corresponding reference voltage vref with the detection temperature of 60 degrees.

The temperature detector 20 is also enabled when the enable signal detenz is at the H level. The temperature detector 20 compares the corresponding reference voltage vref with the detection temperature of 60 degrees with the corresponding monitor voltage vmoni with the chip temperature and then latches the compared result, that is, the temperature detection signal detz by an input of the pulse signal plusez0. Further, since the chip temperature is 65 degrees and the selected detection temperature is 60 degrees, the temperature detector 20 outputs the temperature detection signal detz at the H level.

Since the detection temperature selection signal selz3 is at the H level, the temperature detection signal detz at the H level is reversed and latched by the detection temperature latch circuit 30-3. This causes the detection temperature latch signal latz3 at the H level to be outputted, which results in putting the detection latch signals latz3, latz4 and latz5 into the L, the H an the H levels, respectively.

Since the temperature detection signal detz is at the H level, the detection temperature selector 40-4, by which the detection temperature latch signals latzn−1, latzn and latzn+1 are put into the L, the H and the H levels, is activated. The detection temperature selector 40-4 outputs the detection temperature selection signal selz4 at the H level by an input of the pulse signal pulsez2. This causes the detection temperature to be switched from 60 to 70 degrees.

In the terminal S4 shown in FIG. 11, when the temperature detection enable signal detenz is put into the H level, the reference level circuit 10 is enabled. Currently, since the detection temperature selection signal selz4 is at the H level, the reference level circuit 10 outputs the corresponding reference voltage vref with the detection temperature of 70 degrees.

The temperature detector 20 is also enabled when the enable signal detenz is at the H level. The temperature detector 20 compares the corresponding reference voltage vref with the detection temperature of 70 degrees with the corresponding monitor voltage vmoni with the chip temperature and then latches the compared result, that is, the temperature detection signal detz by an input of the pulse signal plusez0. Further, since the chip temperature is 65 degrees and the selected detection temperature is 70 degrees, the temperature detector 20 outputs the temperature detection signal detz at the L level.

The temperature detection signal detz at the L level is inverted and latched by the detection temperature latch circuit 30-4 when the detection temperature selection signal selz4 is at the H level. This causes the detection temperature latch signal latz4 at the H level to be outputted, so that the detection temperature latch signals latz3, latz4 and latz5 are put into the L, the H and the H levels respectively.

Since the temperature detection signal detz is at the L level, the detection temperature selector 40-3, by which the detection temperature latch signals latzn−1, latzn and latzn+1 are put into the L, the L and the H levels respectively, is activated. The detection temperature selector 40-3 outputs the detection temperature selection signal selz3 at the H level by an input of the pulse signal pulsez2. This causes the detection temperature to be switched from 70 degrees to 60 degrees. Later, if the chip temperature stays at 65 degrees, the operations of the intervals S3 and S4 are repeated so that the detection temperature is switched between 60 degrees and 70 degrees.

As described above, the semiconductor memory device is arranged to change the detection temperature to be compared with the actual chip temperature according to the compared result and minutely change a refresh interval according to the result of comparison between the changed detection temperature and the chip temperature. This arrangement makes it possible to reduce the interval between the data holding time and the refresh interval, thereby being able to lower the power consumption.

The semiconductor memory device according to the present invention is arranged to change the reference temperature to be compared with the detected temperature according to the compared result and minutely change the refresh interval according to the result of comparison between the changed reference temperature and the detected temperature. This arrangement makes it possible to reduce the interval between the data holding time and the refresh interval, thereby being able to lower the power consumption.

The foregoing is considered as illustrative only of the principles of the present invention. Further, since numerous modifications and changes will readily occur to those skilled in the art, it is not desired to limit the invention to the exact construction and applications shown and described, and accordingly all suitable modifications and equivalents may be regarded as falling within the scope of the invention in the appended claims and their equivalents.

What is claimed is:

1. A method of changing a refresh frequency in a semiconductor memory device, comprising:
   detecting a temperature of the memory device to output a temperature signal;
   comparing the temperature signal with a reference temperature signal to output a comparison result signal;
   changing the refresh frequency according to the comparison result signal; and
   selecting the reference temperature signal from a plurality of different reference temperature signals based on said comparison result signal.

2. The method according to claim 1, wherein the refresh frequency is set to higher when the temperature is higher than a reference temperature.

3. The method according to claim 1, further comprising:
   selecting a frequency dividing number of a divider according to the comparison result signal to generate the refresh frequency.

4. The method according to claim 1, further comprising:
   selecting a start reference temperature signal, when a power is turned on, so that a refresh frequency becomes high; and
   comparing the temperature signal with the start reference temperature signal.

5. The method according to claim 1, wherein the plurality of different reference temperature signals are generated based on a voltage that does not depend on variations of the temperature and a power supply.

6. The method according to claim 1, wherein each of the plurality of different reference temperature signals corresponds to one of a plurality of temperatures which are set by incrementing a start temperature by a certain value until reaching an end temperature.

7. The method according to claim 1, further comprising:
latching the comparison result signal into a latch circuit.

8. A method of changing an interval period between a refresh operation in a semiconductor memory device, comprising:
  detecting temperature of said memory device for outputting a temperature signal;
  comparing the temperature signal with a reference temperature signal to output a comparison result;
  changing the interval period between the refresh operation according to said comparison result; and
  selecting the reference temperature signal based on said comparison result.

9. The method according to claim 8, wherein the interval period set to shorter when the temperature is higher than a reference temperature.

10. The method according to claim 8, further comprising:
  selecting a frequency dividing number of a divider according to the comparison result to generate the refresh frequency.

11. The method according to claim 8, further comprising:
  selecting a start reference temperature signal, when a power is turned on, so that the interval period becomes short;
  comparing the temperature signal with the start reference temperature signal.

12. The method according to claim 8, wherein the plurality of different reference temperature signals are generated based on a voltage that does not depend on variations of the temperature and a power supply.

13. The method according to claim 8, wherein each of the plurality of different reference temperature signals corresponds to one of a plurality of temperatures which are set by incrementing a start temperature by a certain value until reaching an end temperature.

14. The method according to claim 8, further comprising:
  latching the comparison result signal into a latch circuit.

* * * * *